United States Patent [19]

Kawakami et al.

[11] Patent Number: 4,503,394
[45] Date of Patent: Mar. 5, 1985

[54] MAGNETORESISTIVE SENSOR HAVING A CLOSED DOMAIN STRUCTURE AND ELECTRODE BIASING

[75] Inventors: Kanji Kawakami, Katsuta; Shinji Narishige, Hitachi; Masahide Suenaga, Odawara, all of Japan

[73] Assignee: Hitachi, Ltd., Tokyo, Japan

[21] Appl. No.: 390,882

[22] Filed: Jun. 22, 1982

[30] Foreign Application Priority Data

Jul. 1, 1981 [JP] Japan .................. 56-101183

[51] Int. Cl.³ .............. G01R 33/06; G11B 5/12; H01L 43/08
[52] U.S. Cl. .................. 324/252; 324/210; 338/32 R; 360/113
[58] Field of Search ............ 324/210, 212, 252; 338/32 R; 360/113

[56] References Cited

U.S. PATENT DOCUMENTS

| | | | |
|---|---|---|---|
| 4,024,489 | 5/1977 | Bajorek et al. | 338/32 R |
| 4,052,748 | 10/1977 | Kuijk | 324/210 X |
| 4,142,218 | 2/1979 | Gorter | 324/252 |
| 4,321,640 | 3/1982 | Van Gestel | 360/113 |
| 4,425,593 | 1/1984 | Postma | 360/113 |

FOREIGN PATENT DOCUMENTS 26814 8/1975 Japan .................. 360/113

OTHER PUBLICATIONS

Bajorek et al., "Magnetoresistive Current Sensor" IBM Tech. Discl. Bull., vol. 18, No. 8, Jan. 1976, pp. 2745–2748.

*Primary Examiner*—Gerard R. Strecker
*Attorney, Agent, or Firm*—Antonelli, Terry & Wands

[57] ABSTRACT

A magnetoelectric conversion element comprises a magnetoresistive effect material having a closed domain structure, a pair of contacts for supply of current flowing through the magnetoresistive effect material, and a bias electrode disposed between the contacts for biasing the direction of the current flow. The bias electrode is disposed so that the respective angles of intersection between the directions of current flow through different magnetic domains of the magnetoresistive effect material biased by the bias electrode and the directions of spontaneous magnetization biased by an external magnetic field are both increased or decreased.

13 Claims, 8 Drawing Figures

MAGNETORESISTIVE SENSOR HAVING A CLOSED DOMAIN STRUCTURE AND ELECTRODE BIASING

The present invention relates to a magnetoelectric conversion element utilizing the magnetoresistive effect. Such a conversion element can be widely used for reading out information stored in a magnetic recording medium or detecting a magnetic field.

A magnetoelectric conversion element utilizing the magnetoresistive effect has features that it can be formed of a thin film of permalloy or other metals; is easy to fabricate; and can be operated in a wide temperature range as compared with a magnetoelectric conversion element utilizing the Hall effect. Accordingly, the element utilizing the magnetoresistive effect is inexpensive and reliable as compared with the element utilizing the Hall effect.

Assuming that an angle between a magnetization vector M and a current vector J is $\theta$, a resistance $R_M$ due to the magnetoresistive effect (hereinafter referred to as MR effect) is given by the following equation:

$$R_M = R_o(1 - \alpha\cos^2\theta) = R_o - \Delta R\cos^2\theta \tag{1}$$

where $R_o$ indicates an initial resistance, $\alpha$ a magnetoresistive constant, and $\Delta R$ a magnitude of change in resistance. As is apparent from the equation (1), the rate $(dR_M/d\theta)$ of change or the resistance $R_M$ in the vicinity of $\theta = 0°$ is small. Therefore, it is required to deflect or bias the magnetization vector M or current vector J so that the conversion element can operate in the vicinity of $\theta = 45°$. Two biasing techniques are known. In a first method, a thin-film permanent magnet or a source of current-induced magnetic field is disposed near a conversion element utilizing the MR effect (see U.S. Pat. No. 4,024,489). In a second method as disclosed in U.S. Pat. No. 4,052,748, an electrode for supplying a current to a conversion element utilizing the MR effect is configured to bias the direction of the current. The second method has an advantage that the number of fabrication steps can be greatly decreased as compared with the first method.

A magnetoelectric conversion element according to the above-mentioned U.S. Pat. No. 4,052,748 has a structure, as shown in FIG. 1, in which a magnetoresistive effect material (hereinafter referred to simply MR material) 1 exhibiting a single domain structure is provided at opposite ends thereof with contacts 2 and 3 for connection to a current source 5 and a bias electrode 4 is provided between the contacts 2 and 3 in inclined relation with respect to the longitudinal direction of the MR material 1 at a predetermined angle. It is a prerequisite for this magnetoelectric conversion element that the directions of spontaneous magnetization are identical in the MR material (or parallel to the longitudinal direction of the MR effect material 1 in the above case) to assume the so-called single domain structure. However, since magnetic poles may exist at end portions of the MR material 1, the assumed single domain structure is unstable so that the MR material may readily take a stable closed domain structure, as illustrated by dot-dash lines in FIG. 1, depending upon the thickness, shape or magnetic hysteresis of the MR material. When the MR material changes from the single domain structure to the closed domain structure, the sensitivity of the magnetoelectric conversion element is greatly deteriorated, as is apparent from the following.

When a current is supplied to flow from the contact 2 to the contact 3, a current vector J is directed substantially perpendicular to the sides of the contacts 2 and 3 and bias electrode 4. A spontaneous magnetization vector $M_o$ is directed substantially parallel to the longitudinal direction of the MR material 1 but oppositely in the left and right halves of the MR material 1. Without application of an external magnetic field $H_{ext}$, the current vector J and the spontaneous magnetization vector $M_o$ intersect at an angle $\theta_o$. However, upon application of the external magnetic field $H_{ext}$ in the direction indicated by an arrow in FIG. 1, the magnetization vector rotates from the direction of $M_o$ through an angle $\theta_1$ to take a direction indicated by $M_1$ in such a manner that an angle between the rotated magnetization vector $M_1$ and the current vector J is equal to $(\theta_o + \theta_1)$ and $(\theta_o - \theta_1)$ at the left and right halves of the MR material, respectively. Thus, the MR effect is cancelled so that the sensitivity of the magnetoelectric conversion element is greatly reduced.

An object of the present invention is to provide a stable and high sensitive magnetoelectric conversion element utilizing the MR effect.

To that end, a magnetoelectric conversion element according to the present invention is characterized in that an MR material having a closed domain structure is used and the inclination of a bias electrode with respect to the direction of spontaneous magnetization has opposite directions at those regions of the MR material having different directions of spontaneous magnetization produced therein.

More particularly, the directions of inclination of segments of at least one bias electrode respectively disposed on the MR material regions having different directions of spontaneous magnetization are established so that the respective angles of intersection between the directions of current flow biased by the bias electrode segments and the directions of spontaneous magnetization biased by an external magnetic field are both increased or decreased in accordance with a change of the external magnetic field.

In the present invention, it is essential that the MR material has a stable closed domain structure. When the MR material has small longitudinal dimensions, the MR material exhibits a stable closed domain structure. However, the closed domain structure becomes unstable with larger longitudinal dimensions of the MR material. Accordingly, when the MR material having large longitudinal dimensions is used, it is preferable to provide means for stabilizing the closed domain structure.

It is preferable to use as the MR material a magnetic material which is formed by an in-field sputtering or evaporation process in which a magnetic field is applied perpendicular to the direction of growth of the magnetic material, since the magnetic material thus formed provides a well-defined closed domain structure.

The present invention will be apparent from the following detailed description taken in conjunction with the accompanying drawings, in which.

Embodiments of a magnetoelectric conversion element according to the present invention will now be explained in detail.

Figure 1:
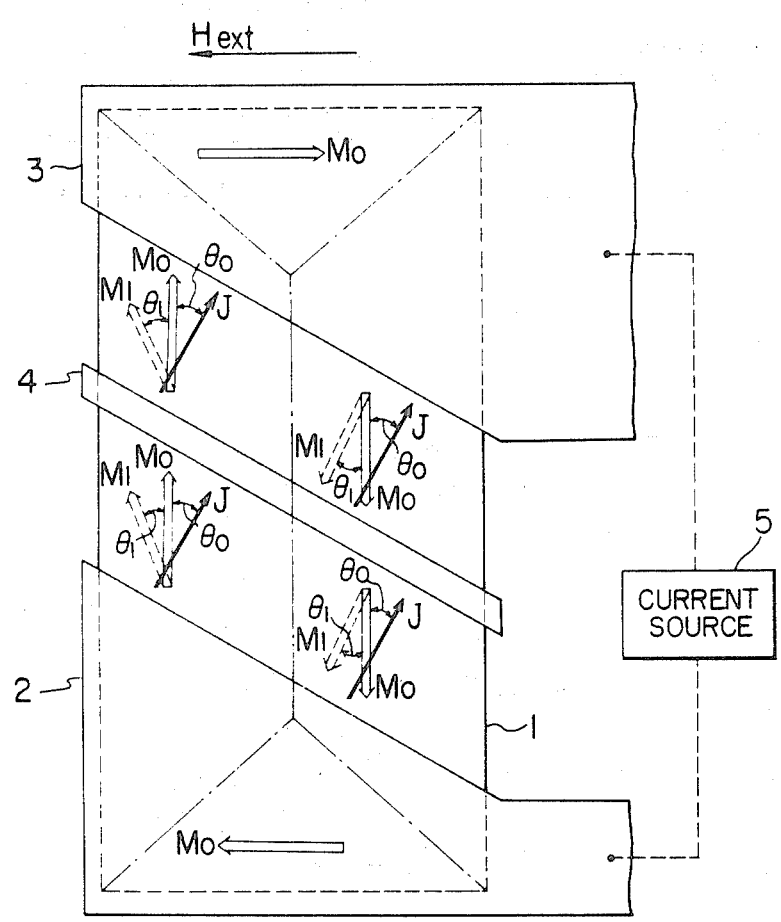
FIG. 1 is a schematic structural view of a conventional magnetoelectric conversion element.
Figure 2:
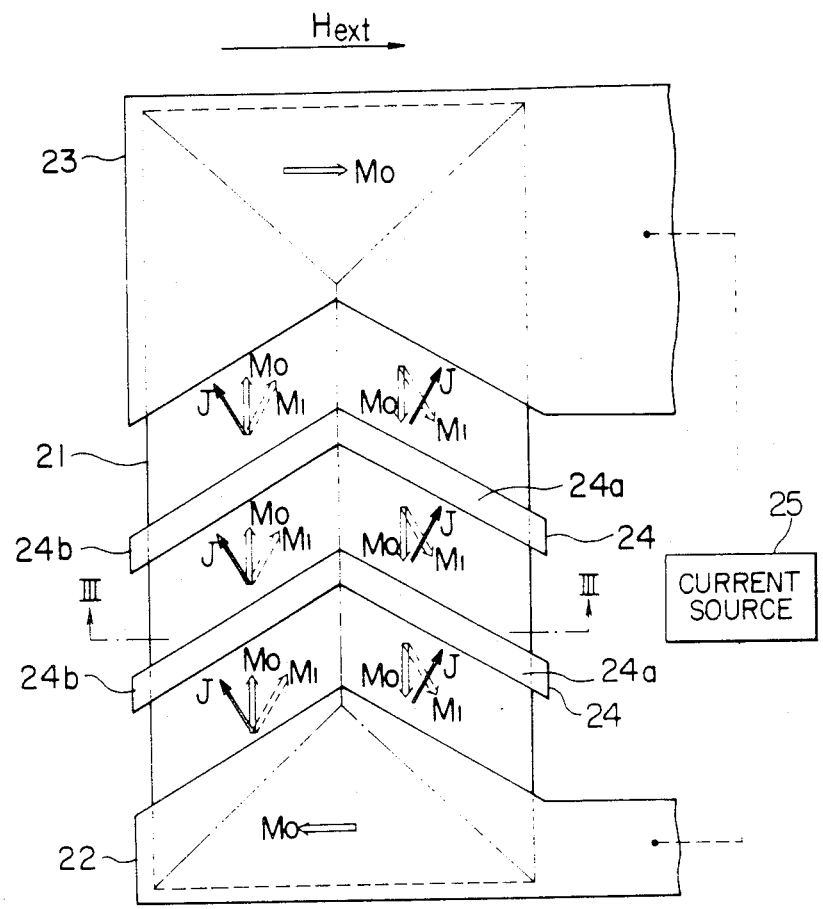
FIG. 2 is a schematic structural view showing an embodiment of a magnetoelectric conversion element according to the present invention.
Figure 3:
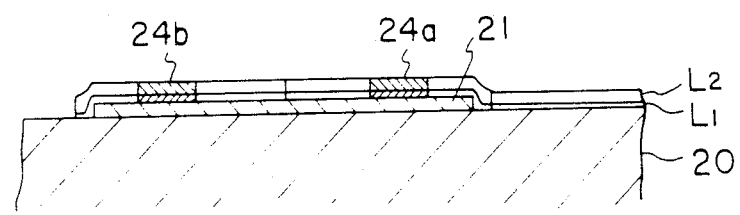
FIG. 3 is a schematic cross section taken along line III—III of FIG. 2.

FIGS. 2 and 3 show an embodiment of a magnetoelectric conversion element according to the present invention. In FIGS. 2 and 3, reference numeral 20 designates a substrate, 21 a magnetoresistive effect material (MR material) provided on the substrate 20 and having the so-called closed domain structure in which the direction of spontaneous magnetization (indicated by thick blank arrows) circulates (clockwise in FIG. 2) as a whole, 22 and 23 contacts provided on opposite ends of the MR material 21 and connected to a current source 25, and 24 bias electrodes each of which is provided on the MR material 21 to extend over both those regions of the MR material having different directions of spontaneous magnetization produced therein but has integral segments 24a and 24b with opposite directions of inclination thereof with respect to the longitudinal direction of the MR material at those regions of the MR material, respectively. In this example, the bias electrode segment 24a provided on a right region of the MR material 21 having the downwardly directed spontaneous magnetization vector $M_o$ is inclined downwardly to the right while the bias electrode segment 24b provided on a left region of the MR material 21 having the upwardly directed spontaneous magnetization vector $M_o$ is inclined downwardly to the left. Though the two bias electrodes 24 are shown, the number of bias electrodes may be arbitrary. In the case where a plurality of bias electrodes are provided, the bias electrode segments on each region of the MR material having one direction of spontaneous magnetization are disposed in the same direction (that is, approximately in parallel to each other) and at the same angle of inclination with respect to the longitudinal direction of the MR material 21. Periphery portions of each of the contacts 22 and 23 facing the bias electrode segments 24a and 24b are inclined with respect to the longitudinal direction of the MR material 21 likeweise the segments 24a and 24b, respectively. With the thus configured bias electrodes 24 and contacts 22 and 23, a current vector J determined depending upon the direction of current flow in the MR material 21 through the bias electrodes 24 between the contacts 22 and 23 can have directions oppositely tilted with respect to the longitudinal direction of the MR material at the MR material regions having different directions of spontaneous magnetization, respectively, as illustrated by thick solid arrows in FIG. 2. When, in this state, an external magnetic field $H_{ext}$ is applied in a direction indicated by an arrow, the spontaneous magnetization vector $M_o$ is biased to take a direction indicated by $M_1$ so that a large angle is provided between the magnetization vector $M_1$ and the current vector J at all portions of the MR material. On the other hand, when the external field $H_{ext}$ is applied in a direction opposite to the direction indicated by the arrow, a small angle is provided between $M_1$ and J at all portions of the MR material.

High sensitivity of magnetoelectric conversion can be attained by thus employing the closed domain structure and providing oppositely biased directions of current flow in accordance with different directions of spontaneous magnetizations, respectively. Further, since the closed domain structure of the MR material is stable, there is no fear of the domain structure being changed due to the shape or magnetic hysteresis of the MR material. Therefore, the element can always exhibit stable sensitivity.

Next, a method of fabricating the magnetoelectric conversion element shown in FIG. 2 will be explained.

First, the substrate 20 is prepared which is made of a nonmagnetic material and at least one surface of which is electrically insulative. The substrate may be made of one selected from a group consisting of glass, $Si + SiO_2$, $SiO_2$ and $Al_2O_3$, or may be a nonmagnetic metal plate with one surface coated with a film made of one selected from a group consisting of glass, $Si + SiO_2$, $SiO_2$ and $Al_2O_3$. A magnetic film made of one selected from a group consisting of 81 to 83% Ni-the balance Fe, Co-Fe and Fe-Si is grown on one surface of the substrate 20 to a thickness of 0.02 to 1 $\mu$m, preferably in a magnetic field, by a sputtering or evaporation process. The magnetic film is patterned through well-known etching techniques to form the MR material 21. Next, a first metal layer $L_1$ having, for example, a thickness of 0.01 to 1 $\mu$m and made of one selected from a group consisting of Cr, Mo and Ti, and a second metal layer $L_2$ having a thickness of 0.5 to 5 $\mu$m and made of one selected from a group consisting of Al, Au, Ni, Pt and Pd are formed on the MR material 21 and substrate 20 by sputtering or evaporation processes. These metal layers are patterned through well-known etching techniques to form the contacts 22 and 23 and the bias electrodes 24. It is preferable that metal materials for forming the contacts 22 and 23 and the bias electrodes 24 have a property of being low electric resistivity, a property of not diffusing into the MR material 21 when temperature is raised during fabrication or use or not degrading the magnetic characteristis of the MR material 21 even if the diffusion into the MR material 21 occurs, and a property of making a low-resistance contact with the MR material 21. The present embodiment shows the case where the contacts 22 and 23 and the bias electrode 24 are formed by the first metal layer $L_1$ of a metal material which prevents diffusion and makes low-resistance contact and the second metal layer $L_2$ of a metal material which has low electric resistivity. The magnetoelectric conversion element is completed by coating the MR material 21, contacts 22 and 23 and bias electrode 24 with a protective layer (not shown) made of $SiO_2$, $Al_2O_3$ or the like.

The change $\Delta V$ in output voltage of such a magnetoelectric conversion element is given by the following equation:

$$\Delta V = \Delta R \cdot I \tag{2}$$

Here, $\Delta R$ has explained in conjunction with the in equation (1) and I is the total current flowing from the contact 22 to the contact 23.

As is evident from the equation (2), $\Delta V$ can be made large by increasing either $\Delta R$ or I. However, the current I has an upper limit determined by factors including a temperature rise in the MR material 21. Accordingly, in order to make ΔV large, it is required to increase ΔR by elongating the effective length of the MR material 21 and hence the length of flow path of the current I.

Figure 4A:
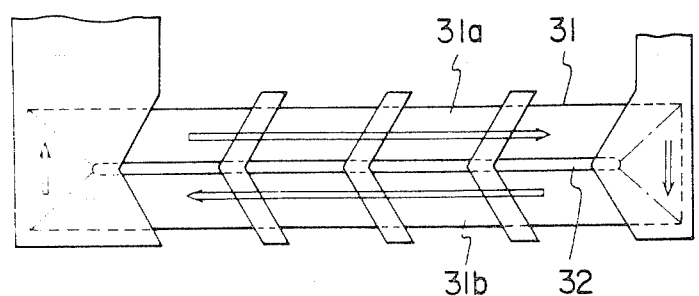
FIGS. 4a and 4b are schematic structural views showing further embodiments of a magnetoelectric conversion element according to the present invention.
Figure 4B:
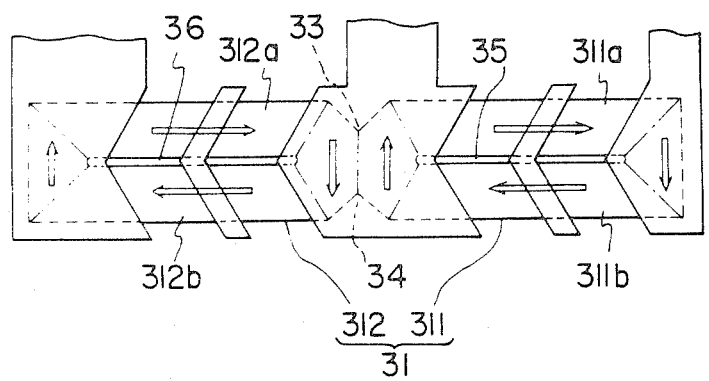
Figure 4C:
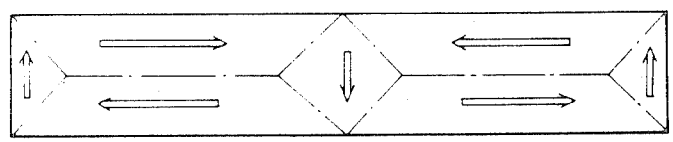
FIG. 4c is a schematic view of an MR effect material for explaining the background of the embodiments shown in FIGS. 4a and 4b.

FIGS. 4a and 4b show further embodiments of a magnetoelectric conversion element according to the present invention, in which the effective length of an MR material is made large. The effective length of the MR material can be made large by making the longitudinal dimensions of the MR material large. When the longitudinal dimensions of the MR material are large, a plurality of separate closed domain structures may be readily produced in the longitudinal direction, as exemplified in FIG. 4c, thereby providing unstable sensitivity. However, stable and high sensitivity can be achieved in such a manner that in the case of the FIG. 4a embodiment a single closed domain structure is forcibly maintained by forming a groove 32 along the longitudinal direction of an MR material 31 and along the boundary between regions 31a and 31b of the MR material 31 which have different directions of spontaneous magnetization while in the case of the FIG. 4b embodiment a plurality of independent stable closed domain structures are provided by dividing the MR material 31 into plural sections 311 and 312 in the longitudinal direction while forming a pair of opposite notches 33 and 34 at the boundary between the sections 311 and 312 and forming grooves 35 and 36 respectively along the longitudinal directions of the sections 311 and 312 and along the boundaries between regions 311a and 311b of the section 311 and between regions 312a and 312b of the section 312 which have different directions of spontaneous magnetization. In FIGS. 4a, 4b and 4c, thick blank arrows indicate the direction of spontaneous magnetization.

When the magnetoelectric conversion element is used at its saturated state, there may be a possibility that the element is not restored to the original closed domain structure, i.e. the circulating direction of spontaneous magnetization is reverse to that in the original structure. This can be prevented by slightly shifting the groove 32 (as shown in FIG. 4a) or the grooves 35 and 36 and notches 33 and 34 (as shown in FIG. 4b) from the center axis of the MR material 31.

A plurality of such magnetoelectric conversion elements as shown in FIG. 4a or 4b may be connected to form a bridge circuit, thereby providing, for example, a magnetoelectric conversion device which is not affected by temperature changes. In this case, since the desired differential operation is not attained if the direction of spontaneous magnetization in each element changes, the described shifted arrangement of the groove(s) (and notches) from the center axis of the MR material can be advantageously employed.

With a magnetoelectric conversion element according to the FIG. 4a embodiment, the FIG. 4b embodiment or the above-described modification thereof, the closure of the closed domain structure can be enhanced, thereby reducing the hysteresis of the MR effect concerning the external magnetic field to provide stable sensitivity.

Figure 5:
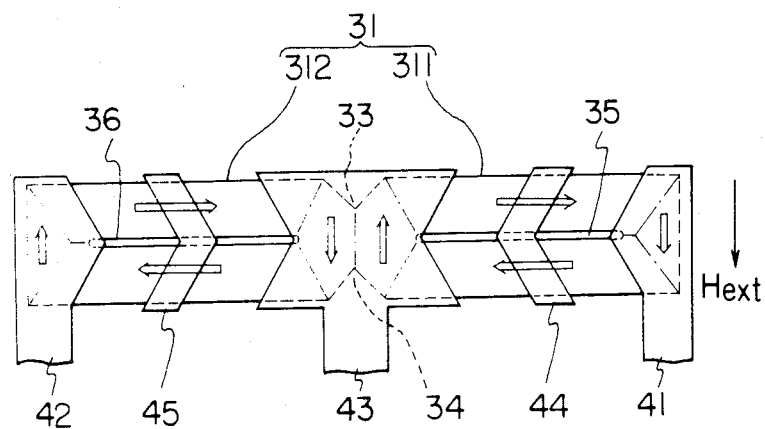
FIG. 5 is a schematic structural view showing a still further embodiment of a magnetoelectric conversion element according to the present invention.

FIG. 5 shows a still further embodiment of a magnetoelectric conversion element according to the present invention, in which a differential operation is implemented. Referring to FIG. 5, an MR material 31 has the same structure as the MR material 31 shown in FIG. 4b, that is, is provided with grooves 35 and 36 and notches 33 and 34 to form sections 311 and 312 each providing a closed domain structure. Contacts 41 and 42 are provided on opposite ends of the MR material 31 while a contact 43 is provided on a central part of the MR material 31. Bias electrodes 44 and 45 are provided on the MR material sections 311 and 312, respectively. The direction of inclination of the bias electrode 44 and the periphery portions of the contacts 41 and 43 facing the bias electrode 44 in the section 311 is opposite to the direction of inclination of the bias electrode 45 and the periphery portions of the contacts 42 and 43 facing the bias electrode 45 in the section 312. With such a configuration, the element differentially operates so that the magnetoresistance between the contacts 42 and 43 decreases when the magnetoresistance between the contacts 41 and 43 increases. Thus, the magnetoelectric conversion element according to the present embodiment can compensate for temperature changes with a single element structure without employing the bridge arrangement explained in conjunction with FIGS. 4a and 4b.

Figure 6:
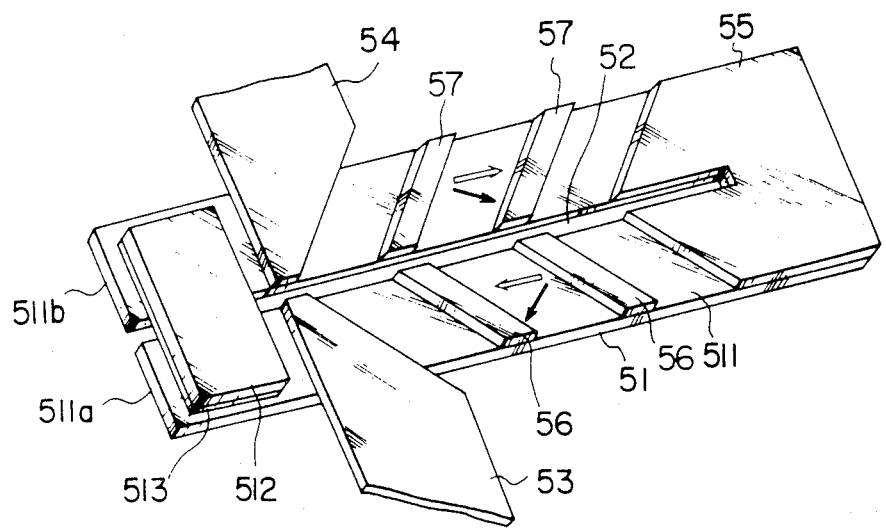
FIG. 6 is a schematic structural view showing another embodiment of a magnetoelectric conversion element according to the present invention.

In the foregoing description, explanation has been made of the case where an MR material of ferromagnetic material having a closed domain structure has opposite ends each of which is continuous. However, the present invention is not limited to such a case. FIG. 6 shows another embodiment of the present invention, in which one of opposite ends of an MR material in the longitudinal direction is discontinuous. Referring to FIG. 6, an MR material 51 has the same shape as the MR material 31 shown in FIG. 4a but is different in that a groove 52 is formed with one of opposite ends thereof oppened at one end of the longitudinal direction of the MR material 51 to provide a long U-shaped form 511 having a pair of leg portions 511a and 511b. A connecting member 512 of magnetic material is provided for magnetically connecting the leg portions 511a and 511b to a closed domain structure as a whole. An electrically insulative member 513 is provided between the leg portions 511a, 511b and the connecting member 512 to electrically isolate from each other. Reference numerals 53 and 54 designate contacts provided in the vicinity of the leg portions 511a and 511b, 55 a contact provided at the other end of the MR material 51 in the longitudinal direction, and 56 and 57 bias electrodes provided respectively on the MR material 51 between the contacts 53 and 55 and between the contacts 54 and 55. The bias electrodes and periphery portions of the contacts facing the bias electrodes are inclined with respect to the longitudinal direction of the MR material, as in the above-mentioned embodiments. According to the present embodiment, the leg portions 511a and 511b can be electrically operated independently of each other, and therefore the effective length of the MR material is made large. For example, when the embodiments shown in FIGS. 2 and 6 include MR materials 21 and 51 having the same length and width, the magnetoresistance between the contacts 53 and 54 in the FIG. 6 embodiment is four times higher than that between the contacts 22 and 23 in the FIG. 2 embodiment, and therefore the output of the FIG. 6 embodiment is four times larger than that of the FIG. 2 embodiment.

The embodiments shown in FIGS. 4a, 4b, 5 and 6 can be formed by a combination of the sputtering or evaporation process and the etching technique, like the embodiment shown in FIG. 2.

In the foregoing description, the typical embodiments of the present invention have been explained by way of example. However, the present invention is not limited to these embodiments, but various changes and modifications are possible. For example, although, in the embodiments shown in FIGS. 2, 4a, 4b and 5, a bias electrode is extended over those regions which have different directions of spontaneous magnetization, the bias electrode may be separated into two parts in the vicinity of the boundary between those regions. Further, the groove 32 in FIG. 4a may be divided into a plurality of grooves along the longitudinal direction. Furthermore, the MR material 31 in FIG. 4b may be divided into three or more sections. It is needless to say that other changes and modifications may be made without departing from the scope and spirit of the present invention.

What is claimed is:

1. A magnetoelectric conversion element comprising:
a magnetoresistive effect material having a closed domain structure including first and second magnetic domains which are disposed in at least a part of said magnetoresistive effect material in its longitudinal direction and which have their directions of spontaneous magnetization reverse to each other in the longitudinal direction of said magnetoresistive effect material and third and fourth magnetic domains which are respectively positioned at opposite ends of said first and second magnetic domains to couple said first and second magnetic domains therethrough;
a pair of contacts for connection to a current source and formed on said magnetoresistive effect material in spaced relation from each other in the longitudinal direction of said magnetoresistive effect material; and
bias electrode means including at least one first segment disposed on said first magnetic domain to extend in a first direction inclined with respect to the longitudinal direction of said magnetoresistive effect material and at least one second segment disposed on said second magnetic domain to extend in a second direction inclined with respect to the longitudinal direction of said magnetoresistive effect material but opposite to said first direction, thereby biasing the direction of current flow through said magnetoresistive effect material between said pair of contacts with respect to the longitudinal direction of said magnetoresistive effect material.

2. A magnetoelectric conversion element according to claim 1, wherein said first and second segments of said bias electrode means are inclined with respect to the longitudinal direction of said magnetoresistive effect material so that the respective angles of intersection between the directions of current flow biased in said first and second magnetic domains by said first and second bias electrode segments and the directions of spontaneous magnetization biased in said first and second magnetic domations by an external magnetic field are both increased or decreased.

3. A magnetoelectric conversion element according to claim 2, wherein each of said pair of contacts has respective periphery portions facing said first and second bias electrode segments and inclined with respect to the longitudinal direction of said magnetoresistive effect material like said first and second bias electrode segments.

4. A magnetoelectric conversion element according to claim 3, wherein said first and second bias electrode segments are integral.

5. A magnetoelectric conversion element according to claim 2, wherein at least one groove is formed in said magnetoresistive effect material between said first and second magnetic domains to extend along the longitudinal direction of said magnetoresistive effect material.

6. A magnetoelectric conversion element according to claim 5, wherein each of said pair of contacts has periphery portions facing said first and second bias electrode segments and inclined with respect to the longitudinal direction of said magnetoresistive effect material like said first and second bias electrode segments, respectively.

7. A magnetoelectric conversion element comprising:
a magnetoresistive effect material having at least two sections adjacent to each other along the longitudinal direction of said magnetoresistive effect material to provide closed domain structures, respectively, each of the magnetoresistive effect material sections including first and second magnetic domains which have their directions of spontaneous magnetization reverse to each other in the longitudinal direction of said magnetoresistive material and third and fourth magnetic domains which are respectively positioned at opposite ends of said first and second magnetic domains to couple said first and second magnetic domains therethrough;
a first contact for connection to a current source and formed on the third and fourth magnetic domains of and adjacent to each other between the adjacent magnetoresistive effect material sections;
second and third contacts for connection to a current source and formed respectively on the fourth and third magnetic domains of and spaced from each other between the outer magnetoresistive effect material sections; and
bias electrode means disposed on the magnetoresistive effect material sections, respectively, each of said bias electrode means including at least one first segment disposed on the first magnetic domain to extend in a first direction inclined with respect to the longitudinal direction of the magnetoresistive effect material and at least one second segment disposed on the second magnetic domain to extend in a second direction inclined with respect to the longitudinal direction of the magnetoresistive effect material but opposite to said first direction, thereby biasing the direction of current flow through the associated magnetoresistive effect material section between the contacts with respect to the longitudinal direction of the magnetoresistive effect material.

8. A magnetoelectric conversion element according to claim 7, wherein the first and second segments of each of said bias electrode means are inclined with respect to the longitudinal direction of the magnetoresistive effect material so that the respective angles of intersection between the directions of current flow biased in the first and second magnetic domains of the associated magnetoresistive effect material section by the first and second bias electrode segments and the directions of spontaneous magnetization biased in the first and second magnetic domations by an external magnetic field are both increased or decreased.

9. A magnetoelectric conversion element according to claim 8, wherein each of said first, second and third contacts has respective periphery portions facing the first and second bias electrode segments and inclined with respect to the longitudinal direction of the magnetoresistive effect material like the first and second bias electrode segments.

10. A magnetoelectric conversion element according to claim 9, wherein a groove is formed in each of the magnetoresistive effect material sections between the first and second magnetic domains thereof to extend along the longitudinal direction of the magnetoresistive effect material, and a pair of notches are formed at the boundary between the adjacent magnetoresistive effect material sections and opposite to each other in a direction perpendicular to the longitudinal direction of the magnetoresistive effect material.

11. A magnetoelectric conversion element comprising:
- a magnetoresistive effect material having a closed domain structure including first and second magnetic domains which have their directions of spontaneous magnetization reverse to each other in the longitudinal direction of said magnetoresistive effect material and third and fourth magnetic domains which are respectively positioned at opposite ends of said first and second magnetic domains to magnetically couple said first and second magnetic domains therethrough, a groove being provided between said first and second magnetic domains along the longitudinal direction of said magnetoresistive effect material to extend across said fourth magnetic domain so that said groove is opened at one end of the longitudinal direction of said magnetoresistive effect material to separate said fourth magnetic domain into two parts;
- a connecting member of magnetic material formed through an electrically insulative member on and over both the two parts of said fourth magnetic domain separated by said groove;
- first and second contacts for connection to a current source and formed respectively on said first and second magnetic domains at the ends thereof near said fourth magnetic domain;
- a third contact formed on said third magnetic domain; and
- bias electrode means including at least one first segment disposed on said first magnetic domain to extend in a first direction inclined with respect to the longitudinal direction of said magnetoresistive effect material and at least one second segment disposed on said second magnetic domain to extend in a direction inclined with respect to the longitudinal direction of said magnetoresistive effect material but opposite to said first direction, thereby biasing the direction of current flow through said magnetoresistive effect material between the contacts with respect to the longitudinal direction of said magnetoresistive effect material.

12. A magnetoelectric conversion element according to claim 11, wherein said first and second segments of said bias electrode means are inclined with respect to the longitudinal direction of said magnetoresistive effect material so that the respective angles of intersection between the directions of the current flow biased in said first and second magnetic domains by said first and second bias electrode segments and the directions of spontaneous magnetization biased in said first and second magnetic domations by an external magnetic field are both increased or decreased.

13. A magnetoelectric conversion element according to claim 12, wherein said first and second contacts have peripheral portions facing said first and second bias electrode segments and inclined with respect to the longitudinal direction of said magnetoresistive effect material likewise said first and second bias electrode segments, respectively, and said third contact has respective peripheral portions facing said first and second bias electrode segments and inclined with respect to the longitudinal direction of said magnetoresistive effect material likewise said first and second bias electrode segments.

* * * * *